(12) United States Patent
Chen et al.

(10) Patent No.: US 10,060,820 B2
(45) Date of Patent: Aug. 28, 2018

(54) STRESS-ISOLATED ABSOLUTE PRESSURE SENSOR

(71) Applicant: Continental Automotive Systems, Inc., Auburn Hills, MI (US)

(72) Inventors: Shiuh-Hui Steven Chen, Lake Zurich, IL (US); Jen-Huang Albert Chiou, Libertyville, IL (US); Robert C. Kosberg, Grayslake, IL (US); Daniel Roy Empen, Lake Villa, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 138 days.

(21) Appl. No.: 15/209,185

(22) Filed: Jul. 13, 2016

(65) Prior Publication Data

US 2017/0176278 A1    Jun. 22, 2017

Related U.S. Application Data

(60) Provisional application No. 62/270,717, filed on Dec. 22, 2015.

(51) Int. Cl.
*G01L 9/00* (2006.01)
*G01L 9/06* (2006.01)
(Continued)

(52) U.S. Cl.
CPC .......... *G01L 19/146* (2013.01); *B81B 7/0045* (2013.01); *G01L 9/0054* (2013.01); *G01L 9/0055* (2013.01); *G01L 9/06* (2013.01); *G01L 19/0046* (2013.01); *G01L 19/0069* (2013.01); *G01L 19/02* (2013.01); *G01L 19/04* (2013.01); (Continued)

(58) Field of Classification Search
CPC ....... G01L 9/00; G01L 9/0054; G01L 9/0055; G01L 9/06; G01L 19/00; G01L 19/0046; G01L 19/0049; G01L 19/02; G01L 19/04; G01L 19/14; G01L 19/146; G01L 19/147;
(Continued)

(56) References Cited

U.S. PATENT DOCUMENTS 6,300,169 B1    10/2001    Weiblen et al.
7,749,797 B2 *  7/2010    Bauer .................... H01L 24/83
                                                              257/433
(Continued)

FOREIGN PATENT DOCUMENTS

DE    102010042113 A1    4/2012
EP    2679536 A2         1/2014
(Continued)

OTHER PUBLICATIONS

Spiering et al., "Realization of Mechanical Decoupling Zones for Package-Stress Reduction", Sensors and Actuators—A Physical; Jun. 1, 1993, pp. 800-804, vol. A37/A38, Elsevier BN, NL.
(Continued)

*Primary Examiner* — Nguyen Ha

(57) ABSTRACT

Suspending a microelectromechanical system (MEMS) pressure sensing element inside a cavity using spring-like corrugations or serpentine crenellations, reduces thermally-mismatched mechanical stress on the sensing element. Overlaying the spring-like structures and the sensing element with a gel further reduces thermally-mismatched stress and vibrational dynamic stress.

31 Claims, 11 Drawing Sheets

(51) Int. Cl.
*G01L 19/00* (2006.01)
*G01L 19/04* (2006.01)
*G01L 19/14* (2006.01)
*B81B 7/00* (2006.01)
*G01L 19/02* (2006.01)

(52) U.S. Cl.
CPC .......... *G01L 19/147* (2013.01); *G01L 19/148* (2013.01); *H01L 2224/48091* (2013.01)

(58) Field of Classification Search
CPC ..... G01L 19/148; G01L 19/0069; B81B 7/00; B81B 7/0045; H01L 2224/48091
See application file for complete search history.

(56) References Cited

U.S. PATENT DOCUMENTS

| | | | |
|---|---|---|---|
| 7,997,142 B2* | 8/2011 | Chiou | G01L 9/0042 73/715 |
| 8,164,153 B2 | 4/2012 | Ding et al. | |
| 8,304,275 B2 | 11/2012 | Schlarmann et al. | |
| 2004/0226383 A1 | 11/2004 | Romo | |
| 2007/0090473 A1* | 4/2007 | Engling | B81B 7/0058 257/414 |
| 2007/0279845 A1* | 12/2007 | Kuhnt | G01L 19/0645 361/679.01 |
| 2014/0197502 A1 | 7/2014 | Dehe | |
| 2015/0048461 A1* | 2/2015 | Mayer | G01L 19/0069 257/415 |
| 2015/0090041 A1 | 4/2015 | Imai | |
| 2015/0114129 A1* | 4/2015 | Chen | G01L 9/0052 73/721 |
| 2015/0305160 A1* | 10/2015 | Funahashi | H01L 23/13 348/374 |
| 2015/0307344 A1* | 10/2015 | Ernst | B81B 7/0048 257/417 |
| 2015/0330856 A1 | 11/2015 | Chiou et al. | |
| 2015/0369681 A1* | 12/2015 | Imai | G01O 5/06 73/727 |

FOREIGN PATENT DOCUMENTS

| | | | |
|---|---|---|---|
| EP | 2840375 A1 | 2/2015 | |
| JP | 02196938 A * | 8/1990 | ............... G01L 9/04 |

OTHER PUBLICATIONS

International Search Report and Written Opinion dated Nov. 11, 2016 from corresponding International Patent Application No. PCT/US2016/050138.
Suspended membrane: first appeared ~ 1990.
Stephen Beeby et al., "MEMS Mechanical Sensors", 2004, Artech House, Inc., ISBN 1-58053-536-4.
W. Yeh et al. "Novel TPMS sensing chip with pressure embedded in accelerometer", Transducers, 2013, pp. 1759-1762, IEEE (Barcelona, Spain).
Yangxi Zhang et al., "A Wafer-level pressure calibration method for integrated accelerometer and pressure sensor in TPMS application", Transducers., 2015, pp. 2164-2167, IEEE (Anchorage, Alaska, USA).

* cited by examiner

- PRIOR ART -

# STRESS-ISOLATED ABSOLUTE PRESSURE SENSOR

BACKGROUND

Microelectromechanical system (MEMS) pressure sensors are well known. Examples of such sensors are disclosed in various U.S. patents including but not limited to: U.S. Pat. No. 7,997,142 issued Aug. 16, 2011, entitled, "Low pressure sensor device with high accuracy and high sensitivity," U.S. Pat. No. 8,215,176 issued Jul. 12, 2013, entitled "Pressure sensor for harsh media sensing and flexible packaging," and U.S. Pat. No. 8,833,172 issued Sep. 16, 2014, entitled "Pressure sensing device with stepped cavity to minimize thermal noise," the contents of each being incorporated by reference in their entireties.

Those of ordinary skill in the MEMS pressure sensing art know that the thermally-mismatched mechanical stress or vibrational dynamic stress on a MEMS pressure sensing element adversely affects the device's accuracy. Reducing or eliminating thermally-mismatched stress and vibrational dynamic stress is therefore important to improving MEMS pressure sensing element accuracy.

DETAILED DESCRIPTION

Figure 1A:
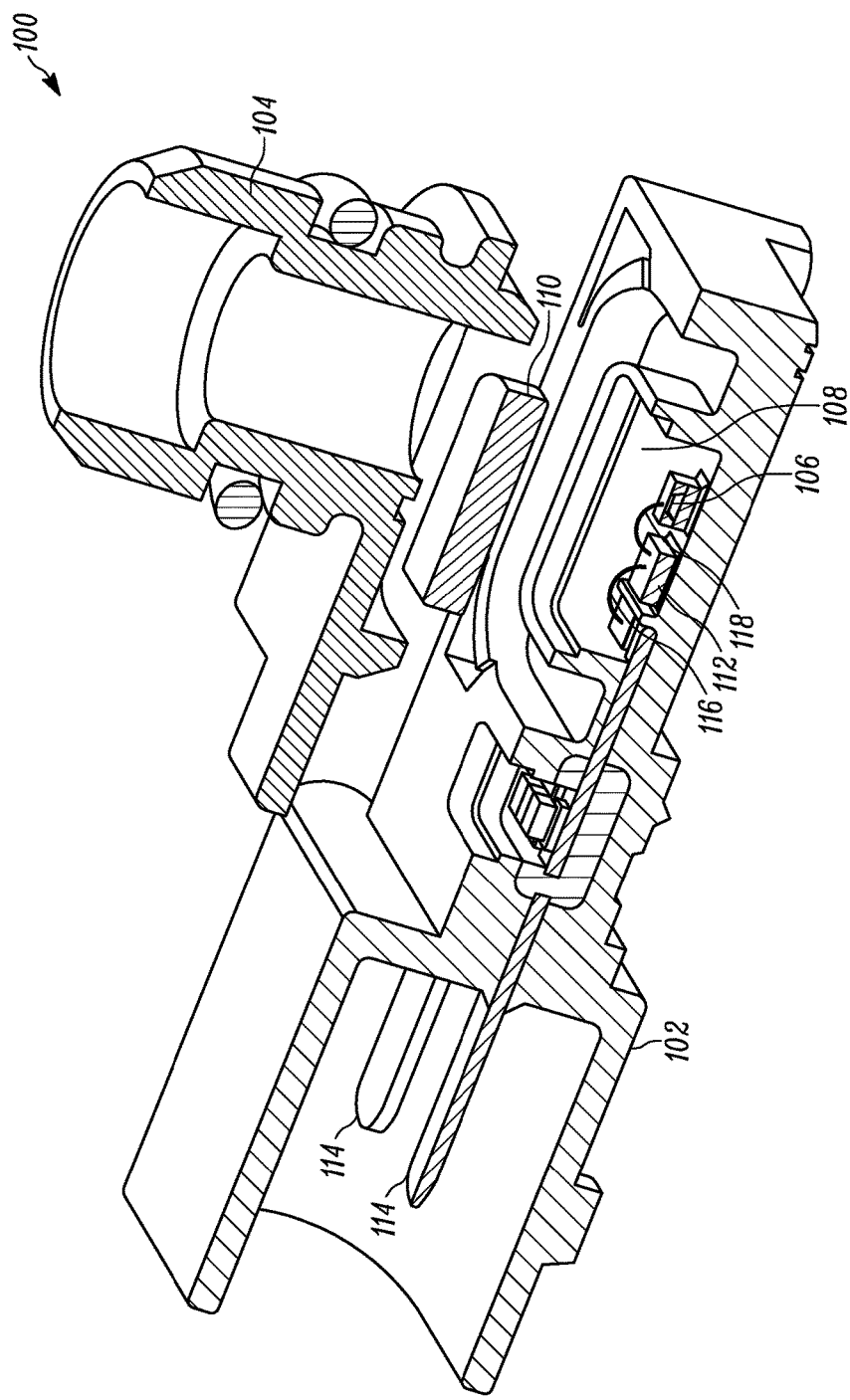
FIG. 1A is a perspective view of a pressure sensor employing a MEMS pressure sensing element in the prior art.

Referring now to FIG. 1A in an exploded view, a MEMS pressure sensor 100 comprises a main housing 102 having a port 104 that conducts pressurized fluid to a MEMS pressure sensing element 106 located inside a housing cavity 108, which is inside the plastic housing 102. A layer of viscous gel 110 is overlaid both the MEMS pressure sensing element 106 and an application specific-integrated circuit (ASIC) 112, also mounted inside the housing cavity 108.

Figure 1B:
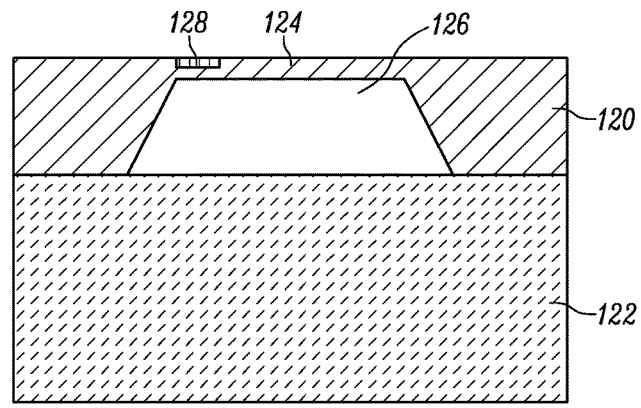
FIG. 1B shows a cross-sectional diagram of the MEMS pressure sensing element in FIG. 1A.

Electrical signals are provided to and received from the ASIC 112 through metal "lead frames" 114 that extend through the plastic housing 102. The lead frames 114 are electrically coupled to the ASIC 112 through small bond wires 116. On the other side of the ASIC 112, bond wires 118 connect the ASIC 112 with the MEMS pressure sensing element 106. The cross-sectional diagram of the MEMS pressure sensing element 106 in the prior art is depicted in FIG. 1B. The MEMS pressure sensing element 106 comprises a silicon substrate 120 with a diaphragm 124 and a cavity 126 and anodically bonded to a glass substrate 122. The cavity 126 is near vacuum for topside pressure sensing by a plurality of piezoresistors 128 formed near the edge of the diaphragm 124 on the top side.

Figure 2:
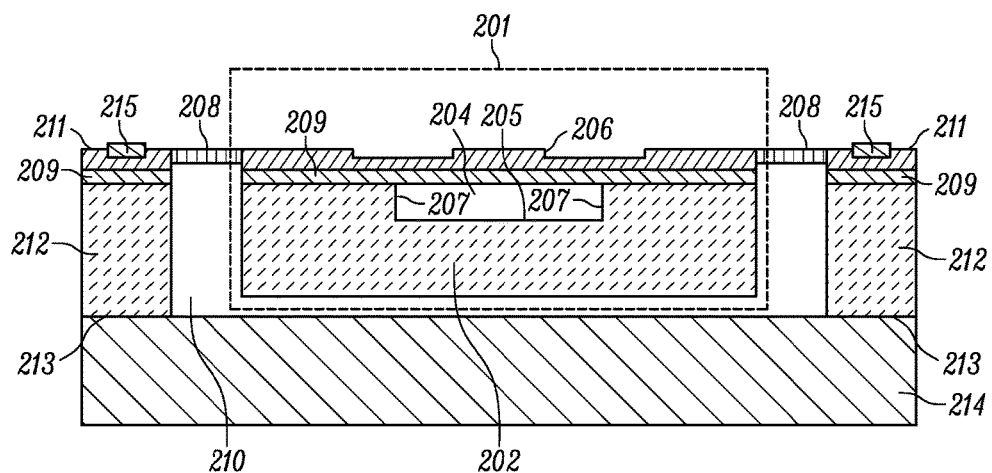
FIG. 2 is a cross-sectional diagram of a stress-isolated MEMS pressure sensor.
Figure 3:
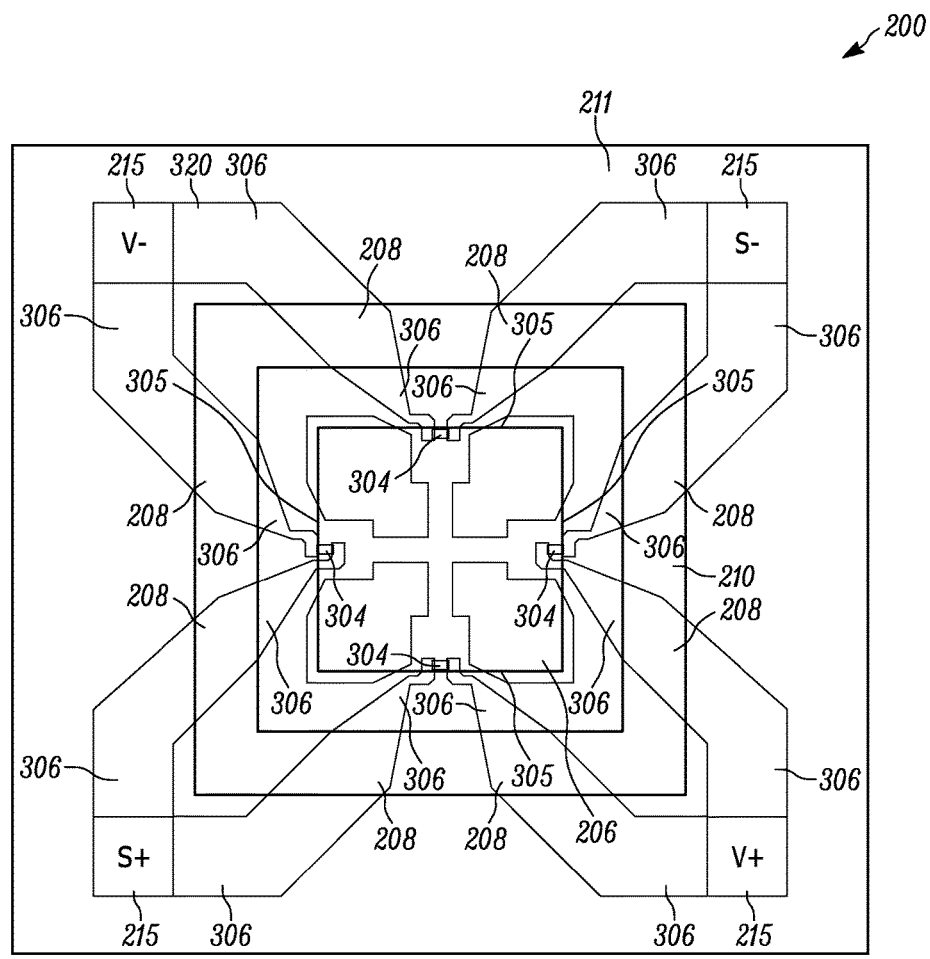
FIG. 3 is a top or plan view of a stress-isolated MEMS pressure sensor shown in FIG. 2.

Inaccuracy or noise caused by thermally-induced and/or vibrational mechanical stress on the MEMS pressure sensing element 106 can be reduced by an improved MEMS pressure sensing element 201 with flexible "springs" or "suspenders", which are formed from the same semiconductor material as shown in FIG. 2. In the preferred embodiment, the springs are made to be electrically conductive by doping and carry signals to and from a plurality of piezoresistors 304 as shown in FIG. 3. Additional mechanical stress isolation is provided to the stress-isolated MEMS pressure sensor 200 by overlaying the springs with the viscous gel 110 to damp out and reduce the vibrational dynamic stress.

FIG. 2 is a cross-sectional diagram of a preferred embodiment of a stress-isolated pressure sensor 200 that comprises a MEMS pressure sensing element 201 with an internal vacuum cavity 204. The cavity 204 has a bottom surface 205 and is defined by or bounded by sidewalls 207, which are substantially orthogonal to the bottom surface 205.

A thin semiconductor diaphragm 206 having piezoresistors, as described in the aforementioned prior art patents, is formed and attached to the substrate 202 by a thin layer of silicon dioxide 209.

As used herein, the term "suspender" refers to a structure by which something is suspended or supported. As shown in FIG. 2, the MEMS pressure sensing element 201 having the diaphragm 206 is suspended in a cavity 210 by a plurality of suspenders 208 formed from the same semiconductor material from which the substrate 202 and the diaphragm 206 are made. The cavity 210 is formed by bonding a bottom surface 213 of a silicon rim 212 to a substrate 214.

If the substrate 214 is a glass substrate, the silicon rim 212 can be anodically bonded onto the substrate 214. If the substrate 214 is a silicon substrate, the silicon rim 212 can be fusion-bonded onto the substrate 214 or glass-frit-bonded onto the substrate 214.

FIG. 3 is a top or plan view of the stress-isolated pressure sensor 200 shown in FIG. 2. The diaphragm 206 is essentially square and thus has four edges 305. Piezoresistors 304 are formed to be located adjacent to each edge 305 of the diaphragm 206. The piezoresistors 304 are electrically connected with each other by a plurality of P+ interconnects 306 and bond pads 215 to form a Wheatstone bridge circuit 320. As is well known, and explained in at least the issued patents noted above, deformation of the diaphragm 206 responsive to pressure applied to its top surfaces causes the piezoresistors 304 to deform and stressed. When they deform and are stressed, their resistance changes. When a constant-value input voltage is applied to input terminals of the Wheatstone bridge circuit, the voltage output from the Wheatstone bridge changes responsive to deformation and stresses, i.e., responsive to diaphragm deflection and stresses due to the applied pressure.

Each piezoresistor 304 has of course two terminal ends. Each end of each piezoresistor 304 is connected to a suspender 208, each of which is doped to make the suspenders 208 electrically conductive.

Each suspender 208 is "connected" to a bond pad 215 on the top surface 211 of the diaphragm 206. The suspenders 208 thus perform three functions: supporting the diaphragm 206, providing stress isolation, and providing a conductive signal path to and from the piezoresistors 304.

Figure 4A:
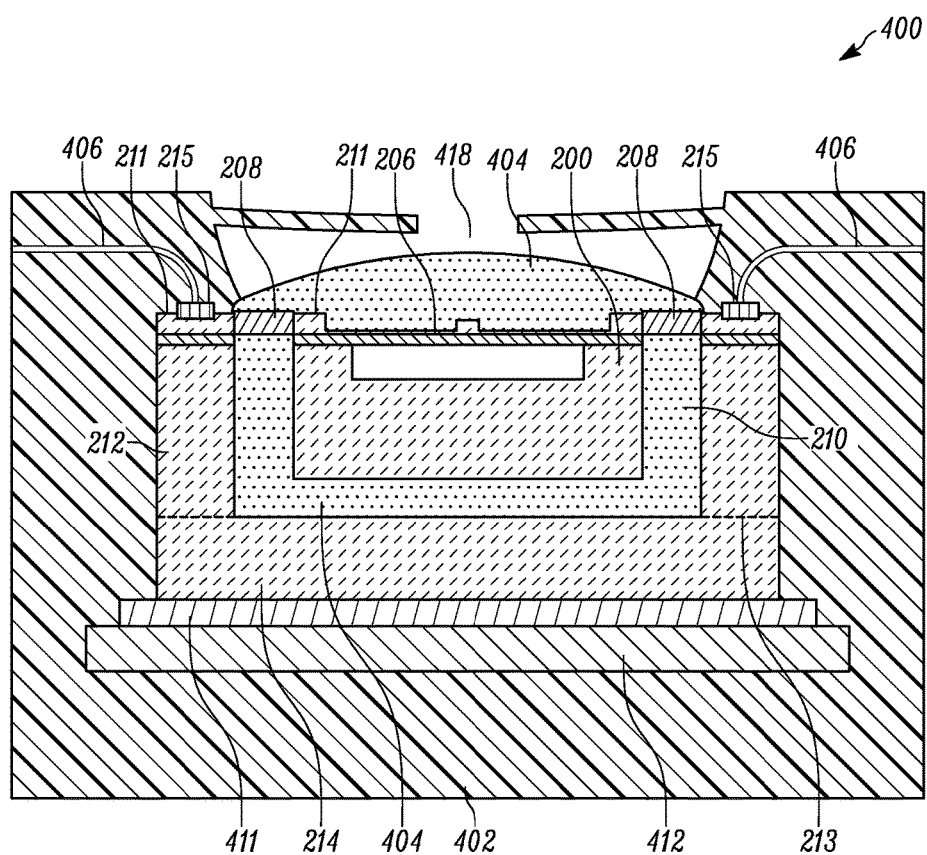
FIG. 4A is a cross-sectional diagram of an overmolded stress-isolated pressure sensor employing a MEMS pressure sensing element using bond wires as interconnections.

FIG. 4A is a cross-sectional diagram of an overmolded stress-isolated pressure sensor 400. The stress-isolated pressure sensor 200 is attached to a printed circuit board (PCB) 412 or the lead frames 114, with adhesive 411. An overmold 402 using materials such as thermoplastic materials to overmold the stress-isolated pressure sensor 200 and bond wires 406, which connects the stress-isolated pressure sensor 200 to the ASIC 112 or the lead frame 114. Gel 404 is dispensed to cover the top surface 211 of the stress-isolated pressure sensor 200 to protect the Wheatstone bridge circuit 320. A through hole 418 is formed by the overmold 402 to allow the pressure media to pass through the hole 418 to reach the top surface of the gel 404. The viscous gel 404 is soft enough to transmit pressure applied thereon to the diaphragm 206 of the MEMS pressure sensing element 201. The gel 404 is also filled into the cavity 210. The gel 404 can damp down the dynamic stress and reduce the noise sensed by the piezoresistors 304 on the diaphragm 206 during vibration or impact.

Figure 4B:
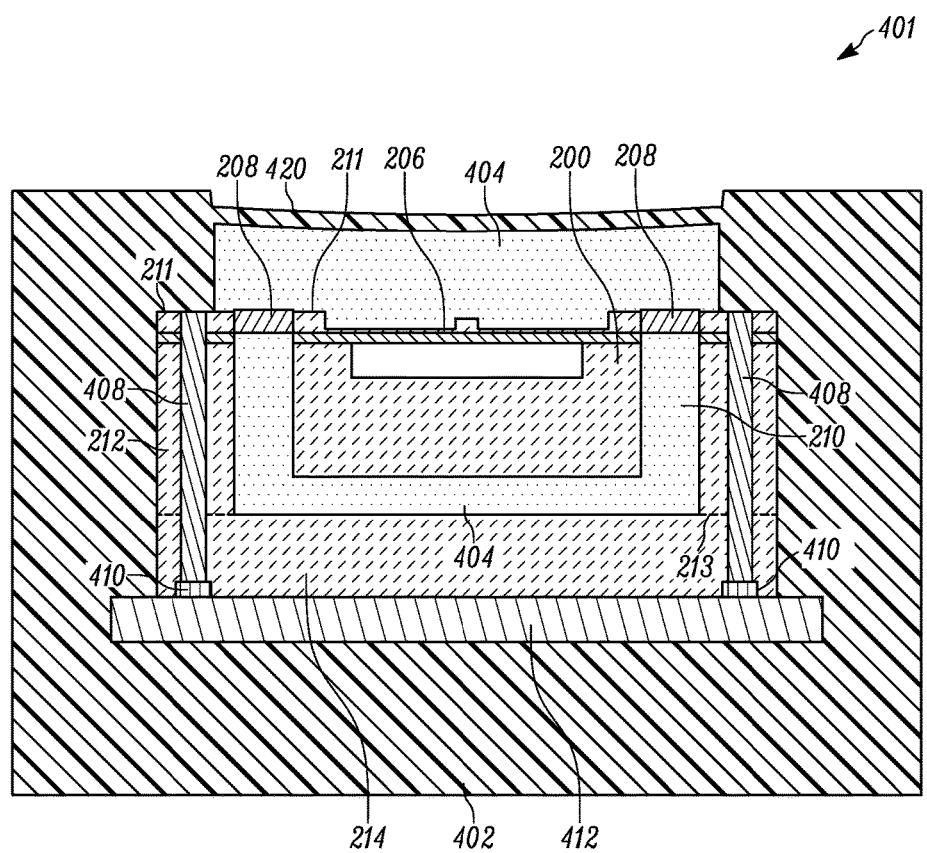
FIG. 4B is a cross-sectional diagram of an overmolded stress-isolated pressure sensor employing a MEMS pressure sensing element using conductive through vias as interconnections.

FIG. 4B is a cross-sectional diagram of an overmoled stress-isolated pressure sensor 401, which comprises a stress-isolated pressure sensor 200 using different electrical interconnections with through-vias 408 and solder bumps 410 to connect to a PCB 412 or the lead frames 114 for voltage signal input and output. The gel 404 fills in the cavity completely over the MEMS pressure sensing element 201 and is overmolded by the overmold 402 without an open space. A membrane 420 is formed by the overmold 402 on the top of the gel 404. The membrane 420 is flexible to transmit pressure applied thereon to the gel and the diaphragm 206 of the MEMS pressure sensing element 201.

The stress-isolated pressure sensor can be also contained in the injection-molded plastic housing 102 in the prior art as shown in FIG. 1A by replacing the MEMS pressure sensing element 106 by the stress-isolated pressure sensor 200 in FIG. 2.

The suspenders 208 that support and isolate the MEMS pressure sensing element 201 from stress are formed by either etching the top surface 211 or the bottom surface 213 or etching both surfaces 211 and 213 of the stress-isolated pressure sensor 200. The etching required to form a preferred-embodiment suspender is a multi-step process that forms corrugated suspenders or serpentine suspenders in the material from which the stress-isolated pressure sensor 200 is made. The corrugated suspenders or serpentine suspenders expand and contract responsive to acceleration or movement of the MEMS pressure sensing element 201 and thus act as springs, absorbing mechanical forces that would otherwise be applied to the diaphragm and distort its output signals. Stated another way, the suspenders 208 isolate or alleviate the diaphragm 206 from mechanical stress.

Figure 5:
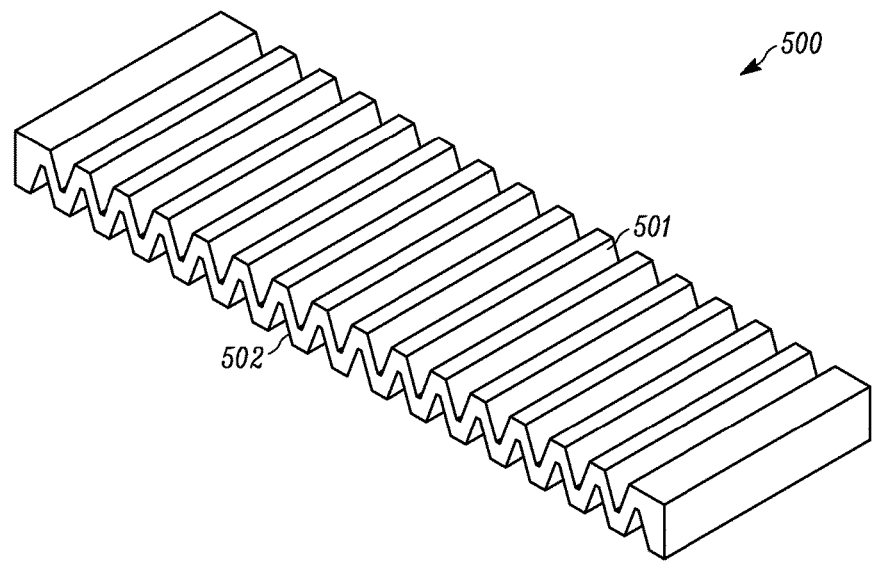
FIG. 5 shows a perspective view and a cross-sectional view of corrugated suspenders that support the MEMS pressure sensing element in the stress-isolated pressure of FIG. 2.
Figure 5:
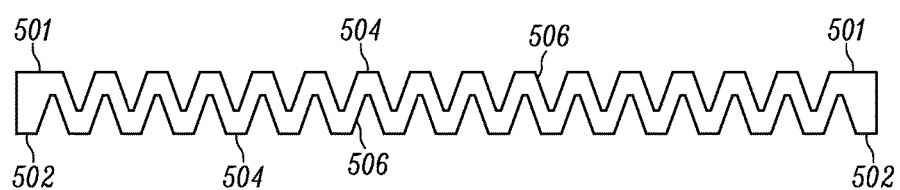

FIG. 5 shows a corrugated suspender 500, which can be one kind of the suspenders 208 used in the stress-isolated pressure sensor 201 as shown in FIG. 2 and FIG. 3 for stress isolation. The corrugated suspender 500 comprises a wavy top surface 501 and a wavy bottom surface 502. The top surface 501 is boron-doped with P+ conductive material as an interconnect connecting the P+ interconnect 306 as shown in FIG. 3. The corrugated suspenders 500 have several substantially planar and horizontal merlons 504, which are "attached" to inclined sections referred to herein as crenels 506. The substantially planar merlons 504 are substantially parallel to the substantially planar top and bottom surfaces of the diaphragm 206 of the stress-isolated MEMS pressure sensing element 201.

Figure 6A:
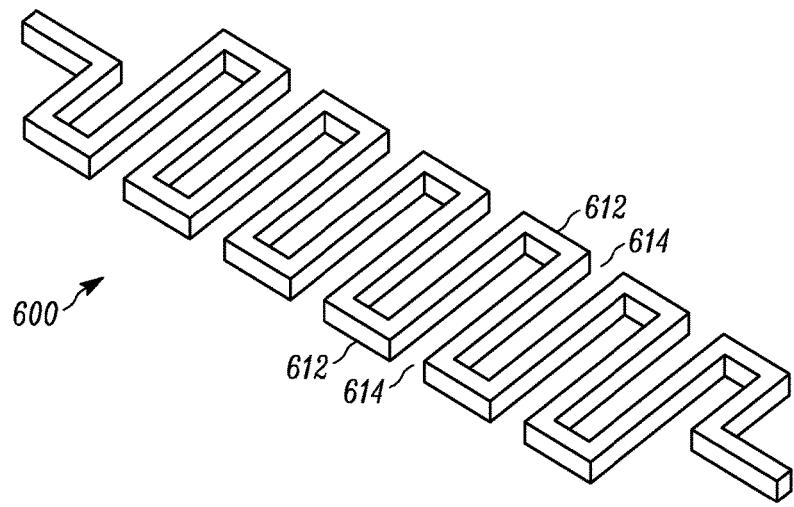
FIG. 6A is a perspective view of serpentine suspenders that support the MEMS pressure sensing element in FIG. 2.
Figure 6B:
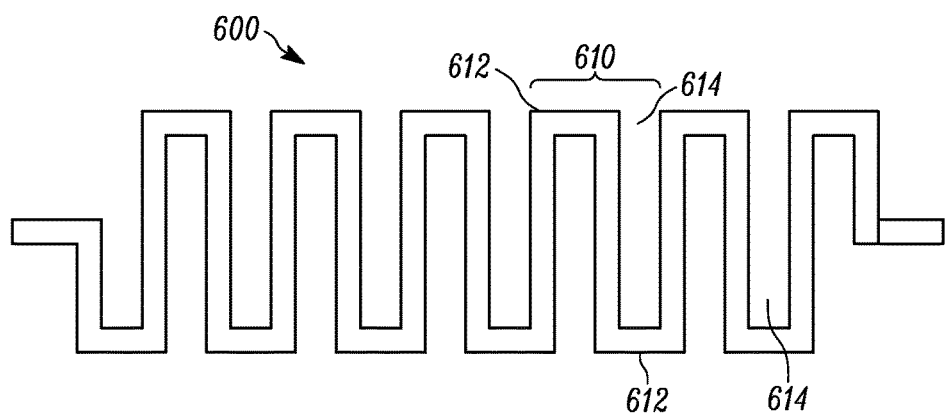
FIG. 6B is a top view of the serpentine suspender.
Figure 6C:
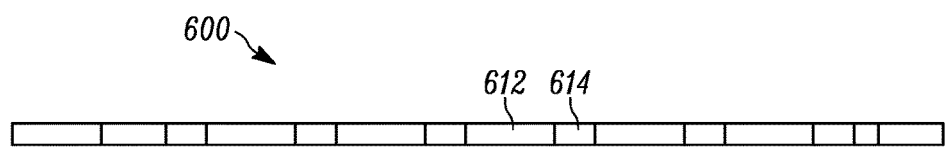
FIG. 6C is a side view of the serpentine suspender.

FIG. 6A is a perspective view of a serpentine suspender 600 that is an alternate for the corrugated suspender 500. FIG. 6B is a top view of the serpentine suspender 600 and FIG. 6C is a side view of the serpentine suspender 600. The material from which the suspender 600 is formed can be doped to be conductive and carry electrical current. It can also support a pressure sensing element in a cavity. Unlike the corrugated suspenders shown in FIG. 5, which have vertically-oriented crenellations, the serpentine suspender 600 has crenellations considered herein to be horizontally-oriented. The serpentine suspender 600 shown in FIG. 6 can be more easily formed by fewer etching steps than the corrugated suspenders shown in FIG. 5 and can thus be considered "preferred."

Each crenellated section 610 has a merlon 612 and a crenel 614. In a preferred embodiment the suspenders 600 are doped to be P+ using conventional processes to make them electrically conductive while at the same time being mechanically flexible.

Figure 7:
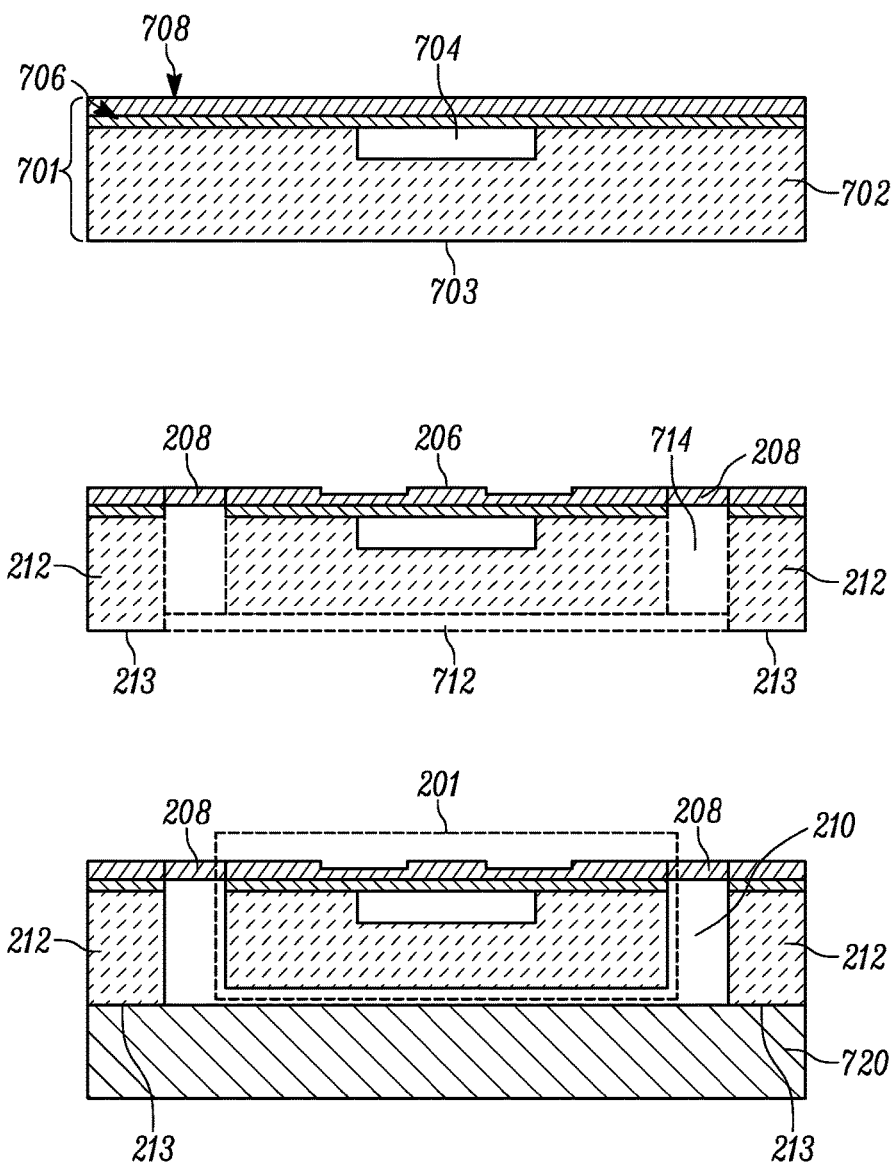
FIG. 7 is a cross-sectional diagram of an embodiment of a stress-isolated MEMS pressure sensor.

Referring now to FIG. 7 there is depicted a cross section and method of forming a stress-isolated pressure sensor. A silicon-on-insulator (SOI) substrate 701 with an internal cavity 704 can be formed, which consists of a silicon support substrate 702, a silicon dioxide layer 706, and a silicon device layer 708. The SOI silicon support substrate 702 is etched by deep reactive ion etching (DRIE) at the center of the bottom surface 703 to effectively form a shallow cavity 712.

The corrugated or serpentine suspenders 208, as described above, are formed after a further DRIE etching process framing a deeper cavity 714 surrounding the MEMS pressure sensing element 201. The shallow cavity 712 and the deeper cavity 714 surrounding the MEMS pressure sensing element 201 constitute the cavity 210. The suspenders 208 support and mechanically isolate the pressure sensing element 201 from the remaining SOI substrate 701.

The etched SOI substrate consisting of the MEMS pressure sensing element 201 is attached to a substrate 720. The entire structure is supported on the substrate 720, which can be glass or silicon.

Figure 8:
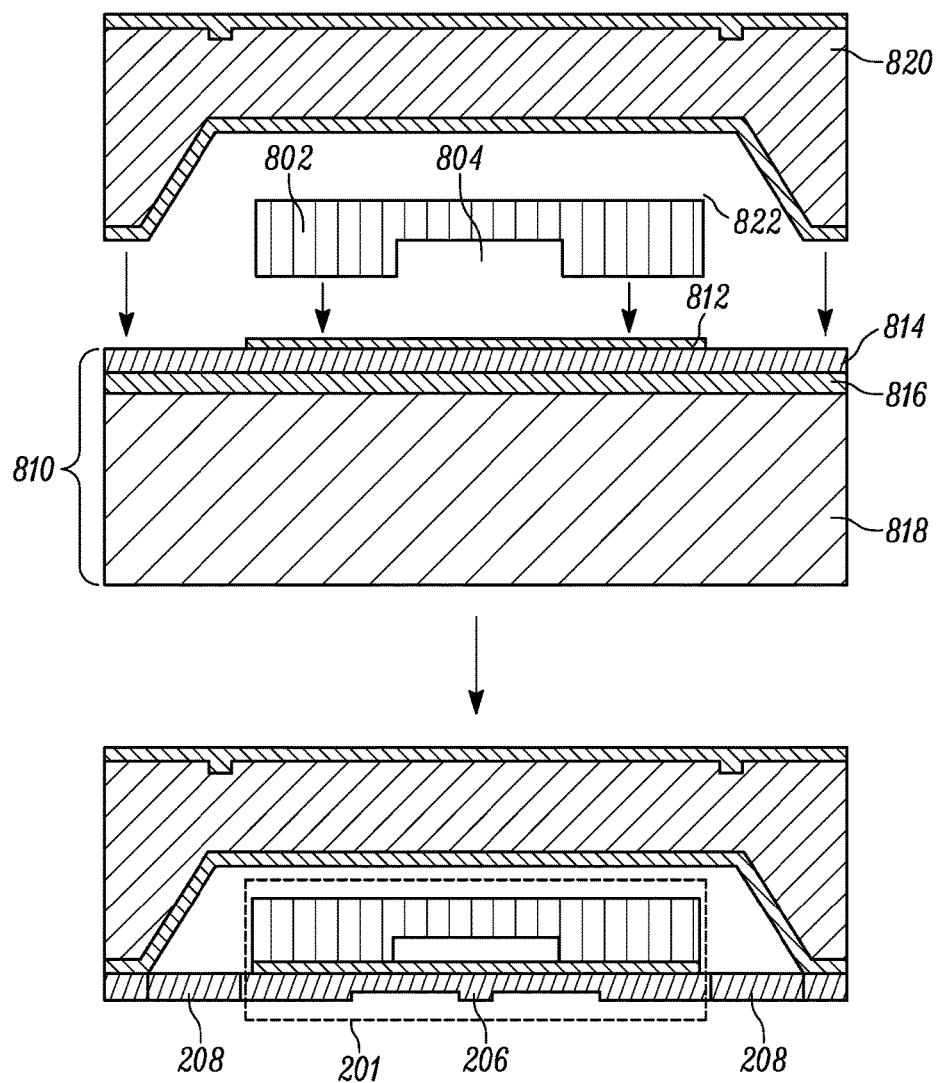
FIG. 8 is a cross-sectional diagram of another embodiment of a stress-isolated MEMS pressure sensor.

FIG. 8 depicts an alternate method of forming a stress-isolated pressure sensor. A first silicon substrate 802 is etched to form a shallow cavity 804 and attached to a SOI substrate 810 to form a bonded substrate. The SOI substrate 810 comprises a silicon dioxide layer 812, a silicon device layer 814, a silicon dioxide layer 816, and a silicon support substrate 818. The rim or edge portion of the bonded substrate is etched from the topside to expose the silicon device layer 814. A silicon or glass cap 820 with a deep cavity 822 formed is then attached to the top surface of the exposed silicon device layer 814 of the bonded substrate 810. If the cap 820 is glass, the cap 820 can be anodically bonded onto the bonded substrate 810. If the cap 820 is silicon, the cap 820 can be fusion-bonded onto the bonded substrate 810 or glass-frit-bonded onto the bonded substrate 810.

The bottom surface of the SOI substrate 810 is etched to define a substantially square-shaped MEMS pressure sensing element 201 having a diaphragm 206 and a plurality of supporting suspenders 208 to form a stress-isolated pressure sensor.

Figure 9:
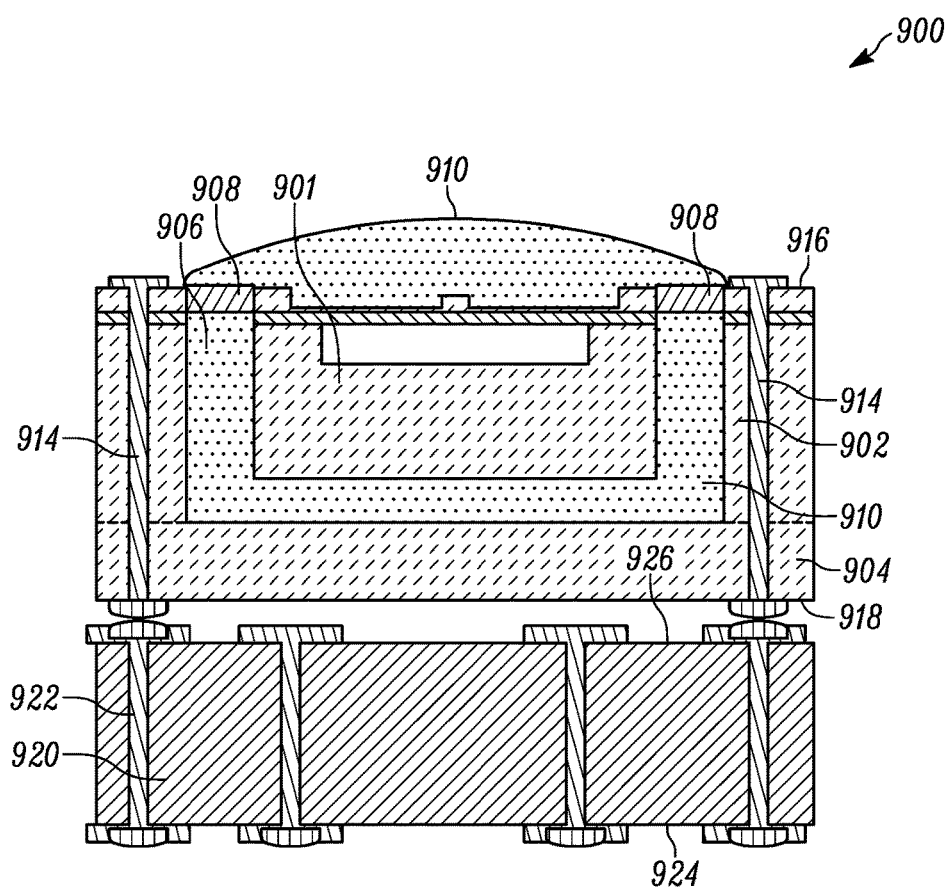
FIG. 9 is a cross-sectional diagram of a stress-isolated MEMS pressure sensor mounted onto an application-specific integrated circuit (ASIC) and connected by conductive vias.

FIG. 9 depicts a stress-isolated pressure sensor 900 comprising a MEMS pressure sensing element 901 attached on top of a silicon or glass substrate 904. A cavity 906 in which the MEMS pressure sensing element 901 is suspended by suspenders 908 is filled with a viscous gel 910 in which the MEMS pressure sensing element 901 is suspended.

Conductive vias 914 extend between the top surface 916 of the substrate 902 and the bottom surface 918 of the substrate 904 and provide conductive pathways to an ASIC 920 having its own conductive through-silicon vias 922. Signals of the ASIC 920 can thus be conducted to and from the MEMS pressure sensing element 901 suspended in a viscous gel by corrugated or serpentine suspenders, which are doped to be electrically conductive.

Figure 10:
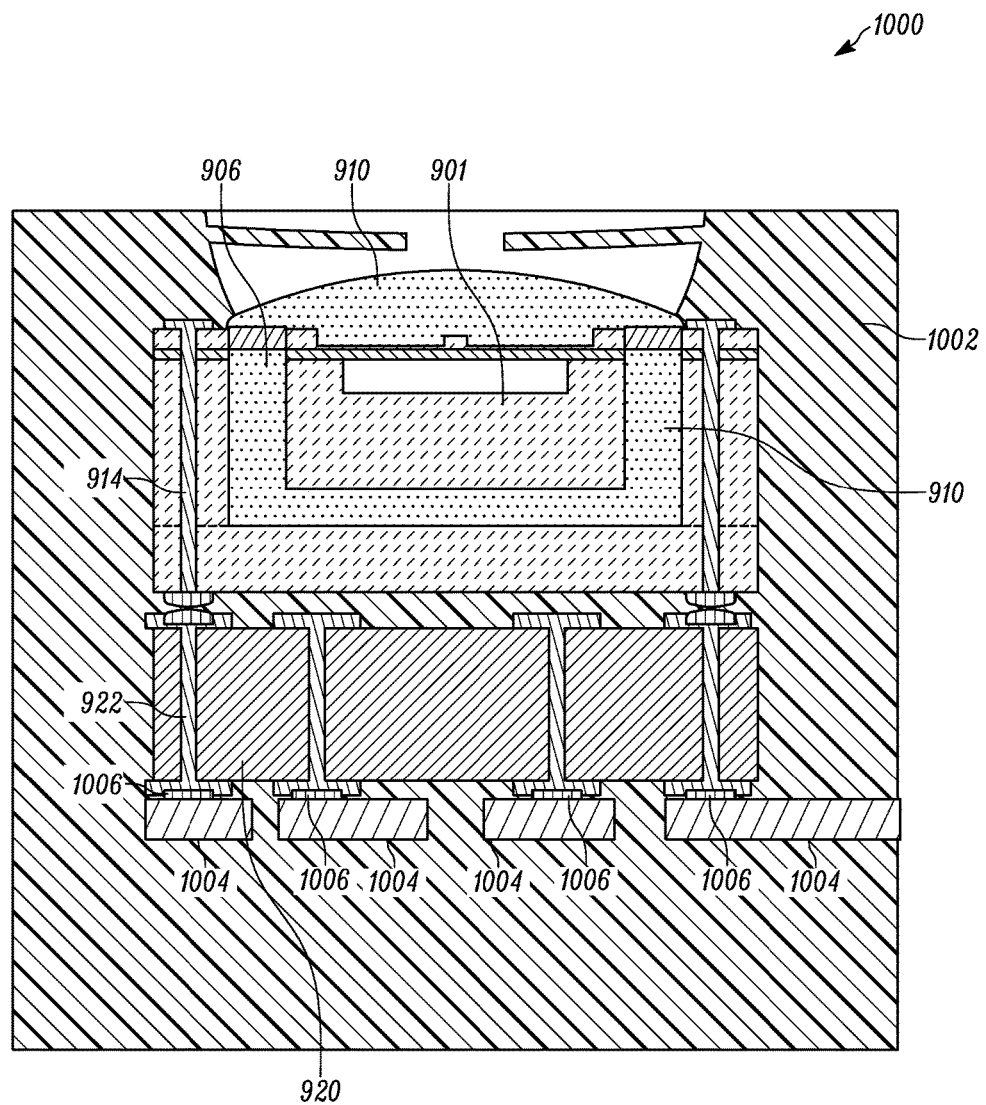
FIG. 10 is a cross-sectional diagram of a stress-isolated MEMS pressure sensing element mounted onto an ASIC using conductive vias and being overmolded

Referring now to FIG. 10, the structure shown in FIG. 9 is shown as being overmolded in an overmold 1002. The stress-isolated pressure sensor 1000 and its overmold 1002 include PCB with conductive traces or conductive lead frames 1004 which extend from exterior surfaces of the overmold 1002 through the overmolding material to the bond pads 1006 on the ASIC 920.

Those of ordinary skill in the art should know that a catenary is the curve assumed by a cord of uniform density and cross section that is perfectly flexible but not capable of being stretched to be horizontal and which hangs freely from two fixed points. Examples of catenaries are power lines and telephone lines suspended from towers or posts.

Those of ordinary skill in the art should recognize that the support or suspension of a MEMS pressure sensing element in a cavity by springs, regardless of the springs' shape will have a shape that is inherently catenary. The spring-like suspenders disclosed herein are thus considered herein to have a shape that is at least partly catenary. The shape assumed by the opposing spring and the MEMS pressure sensing element is also assumed to be at least partially catenary.

The foregoing description is for purposes of illustration only. The true scope of the invention is set forth in the following claims.

What is claimed is:

1. A stress-isolated pressure sensor comprising:
   a cavity bounded by a rim;
   a microelectromechanical system (MEMS) pressure sensing element configured to be suspended inside the cavity, the MEMS pressure sensing element comprising a thin diaphragm, which is formed from a semiconductor material;
   a plurality of suspenders extending between the rim and the MEMS pressure sensing element and supporting the MEMS pressure sensing element in the cavity, the suspenders being flexible, doped to be electrically conductive and formed from the same semiconductor material, which comprises the thin diaphragm.

2. The stress-isolated pressure sensor of claim 1, wherein the rim is attached to a substrate, the stress-isolated pressure sensor further comprising:
   open space between exterior surfaces of:
      the MEMS pressure sensing element and the rim bounding the cavity; and
      the MEMS pressure sensing element and the substrate.

3. The stress-isolated pressure sensor of claim 2, further comprising a gel overlaid the suspenders and the MEMS pressure sensing element, the gel also filling the open space, the gel being selected to transmit pressure applied thereon to the MEMS pressure sensing element.

4. The stress-isolated pressure sensor of claim 1, wherein the MEMS pressure sensing element comprises a diaphragm, which is substantially rectangular with opposing top and bottom surfaces and four sides, at least one of the diaphragm surfaces having a plurality of piezoresistors connected to each other to form a Wheatstone bridge circuit, each piezoresistor being located adjacent to each side of the diaphragm.

5. The stress-isolated pressure sensor of claim 1, wherein the suspenders are serpentine.

6. The stress-isolated pressure sensor of claim 1, wherein the suspenders have cross-sectional shapes, which are corrugated.

7. The stress-isolated pressure sensor of claim 1, further comprising a substrate, the substrate being sized, shaped and arranged to support the rim, the MEMS pressure sensing element and the suspenders.

8. The stress-isolated pressure sensor of claim 7, wherein the substrate is glass.

9. The stress-isolated pressure sensor of claim 8, wherein the substrate is anodically bonded to the rim.

10. The stress-isolated pressure sensor of claim 7, wherein the substrate is silicon.

11. The stress-isolated pressure sensor of claim 10, wherein the substrate is glass-frit bonded to the rim.

12. The stress-isolated pressure sensor of claim 10, wherein the substrate is fusion bonded to the rim.

13. The stress-isolated pressure sensor of claim 7, further comprising an overmold encapsulating the MEMS pressure sensing element, the substrate and the suspenders, the overmold having a cavity sized, shaped and arranged to receive the MEMS pressure sensing element, the substrate and the suspenders.

14. The stress-isolated pressure sensor of claim 13, further comprising a bond wire extending between a conductive pad on the rim and an electrical conductor in the overmold.

15. The stress-isolated pressure sensor of claim 13, further comprising a conductive through via connecting the MEMS pressure sensing element to an electrical conductor in the overmold.

16. The stress-isolated pressure sensor of claim 13, further comprising a gel within the overmold cavity.

17. The stress-isolated pressure sensor of claim 16, further comprising a membrane on the top of the gel, the membrane being configured to contact the gel and selected to transmit pressure applied thereon to the gel and the MEMS pressure sensing element.

18. The stress-isolated pressure sensor of claim 7, further comprising an ASIC attached to an exterior surface of the substrate and electrically coupled to a Wheatstone bridge circuit via conductive through vias.

19. The stress-isolated pressure sensor of claim 18, further comprising a plastic housing configured to accommodate the MEMS pressure sensing element, the substrate, the suspenders, and the ASIC.

20. The stress-isolated pressure sensor of claim 18, further comprising a plastic housing configured to accommodate the ASIC attached to an exterior surface of the substrate and electrically coupled to the Wheatstone bridge circuit via conductive through vias.

21. A stress-isolated pressure sensor comprising:
   a first substrate having a first side and a second side, wherein the second side of the first substrate is etched to form a first cavity;

a second substrate having a first side and a second side, wherein the second side of the first substrate is bonded to the first side of the second substrate;

a third substrate having a first side and a second side, wherein the second side of the third substrate having a second cavity to accommodate the first substrate, and the second side of the third substrate is bonded to the first side of the second substrate;

and the second side of the second substrate is etched to form a diaphragm and a plurality of suspenders, the diaphragm forming a MEMS pressure sensing element and the plurality of suspenders supporting the MEMS pressure sensing element in the cavity of the third substrate, the suspenders being flexible and doped to be electrically conductive.

22. The stress-isolated pressure sensor of claim 21, wherein the first substrate is a silicon substrate.

23. The stress-isolated pressure sensor of claim 22, wherein the second substrate is a silicon-on-insulator (SOI) substrate.

24. The stress-isolated pressure sensor of claim 23, wherein the second substrate is fusion-bonded with the first substrate.

25. The stress-isolated pressure sensor of claim 24, wherein the third substrate is a silicon substrate.

26. The stress-isolated pressure sensor of claim 24, wherein the third substrate is a glass substrate.

27. The stress-isolated pressure sensor of claim 25, wherein the third substrate is fusion-bonded with the second substrate.

28. The stress-isolated pressure sensor of claim 26, wherein the third substrate is anodically-bonded with the second substrate.

29. The stress-isolated pressure sensor of claim 21, wherein the suspenders are serpentine.

30. The stress-isolated pressure sensor of claim 21, wherein the suspenders have cross-sectional shapes, which are corrugated.

31. The stress-isolated pressure sensor of claim 21, further comprising a gel overlaid the suspenders and the MEMS pressure sensing element, the gel also filling the open space, the gel being selected to transmit pressure applied thereon to the MEMS pressure sensing element.

* * * * *